United States Patent [19]

Nelson

[11] B 3,984,253

[45] Oct. 5, 1976

[54] IMAGING PROCESSES AND ELEMENTS THEREFOR

[75] Inventor: Roger W. Nelson, Rochester, N.Y.

[73] Assignee: Eastman Kodak Company, Rochester, N.Y.

[22] Filed: Apr. 22, 1974

[21] Appl. No.: 462,893

[44] Published under the second Trial Voluntary Protest Program on February 24, 1976 as document No. B 462,893.

[52] U.S. Cl. .................................. 96/35.1; 96/48 R; 96/48 HD; 96/87 R; 96/90 R; 96/115 R; 204/159.14; 204/159.18; 204/159.21; 427/43; 427/44

[51] Int. Cl.$^2$ ...................... G03C 1/68; G03C 1/70

[58] Field of Search .............. 96/115 R, 35.1, 90 R, 96/48, 48 HD; 204/159.14, 159.18, 159.21; 117/93.31, 93.31 NV, 93.31 ER; 427/43, 44

[56] References Cited

UNITED STATES PATENTS

| 2,892,712 | 6/1959 | Plambeck | 96/35.1 |
|---|---|---|---|
| 3,779,778 | 12/1973 | Smith et al. | 96/35.1 |

OTHER PUBLICATIONS

Aso, C. et al., J. of Polymer Science: part A–1, Vol. 7, pp. 497–511, 1969.

Primary Examiner—Ronald H. Smith
Attorney, Agent, or Firm—Henry E. Byers

[57] ABSTRACT

A radiation-sensitive element comprises a support having thereon a composition comprising a depolymerizable polymer, such as a polymer of an aromatic 1,2-dialdehyde, and may also contain a radiation-sensitive substance or combination of substances, binder and/or a color-forming substance or combination of substances.

A negative-working radiation-sensitive process comprises exposing a radiation-sensitive element to radiation, following which the element is heated in order to accelerate the depolymerization reaction. A visible image can be formed during heating by the reaction of the released monomer, such as an aromatic 1,2-dialdehyde, with a color-forming substance included in the element or contained in a separate element, or by heat treatment in the presence of a gaseous color-forming reagent.

A positive-working radiation-sensitive process comprises exposing a radiation-sensitive element to radiation following which the element is heated or contacted with a solvent which removes the exposed areas but permits the unexposed areas to remain as a positive resist.

27 Claims, No Drawings

IMAGING PROCESSES AND ELEMENTS THEREFOR

BACKGROUND OF THE INVENTION

Photographic systems of various types are well known, including silver halide, diazo and the like. However, silver halide photographic elements are relatively expensive and normally involve wet processing. Diazo systems have usually been considered slow in speed, are positive-working, and typically are processed using ammonia. Therefore, it has been desirable to provide a nonsilver photographic system which would be negative-working, would be comparable or superior to diazo in speed, and could be processed under dry conditions. One approach to such a system involves the photodegradation of a synthetic organic polymeric material.

For instance, Plambeck in U.S. Pat. No. 2,892,712, issued June 30, 1969, disclosed a process for preparing relief images by the photodegradation of various organic polymers, preferably those having a carbon to carbon polymer chain, but also including unstabilized formaldehyde polymer. Various photopolymerization catalysts or initiators were used. With preferred polymers, the process was not dry since a coating of a liquid solvent or swelling agent was present on the surface of the element during the exposure step. This was necessary because the polymer degradation process with preferred polymers tended to be reversible. In addition, development of the relief image was generally done by means of liquid developers. Furthermore, exposure times were very long because polymer degradation essentially ceased when the radiation source was removed; that is, the system was not capable of amplifying an exposure.

This invention concerns a radiation-sensitive element comprising a depolymerizable polymer, such as a polymer or copolymer of an aromatic 1,2-dialdehyde, and, optionally, a radiation-sensitive substance or combination of substances which upon absorption of radiation is capable of initiating the depolymerization reaction. The radiation-sensitive element may also contain a binder and/or a substance or combination of substances which is capable of forming a colored or fluorescent reaction product with the monomer produced in the depolymerization reaction.

This invention also comprises a process of exposing to radiation a composition comprising a depolymerizable polymer, such as a polymer of an aromatic 1,2-dialdehyde, and, optionally, a photosensitive substance or combination of substances which upon absorption of radiation gives a product capable of initiating the depolymerization reaction, for example, an acidic product. After exposure, the composition is heated to a temperature of up to about 150°C, forming a monomer such as an aromatic 1,2-dialdehyde. A visible image can be formed during heating by the reaction of the released monomer with a color-forming substance or substances included in the element, by heating in contact with a separate element containing the color former, or by heat treatment in the presence of a gaseous color-forming reagent, such as ammonia. Alternatively, a fluorescent image may be produced by an appropriate choice of a substance or combination of substances which reacts with the monomer.

A positive-working radiation-sensitive process comprises exposing a radiation-sensitive element to radiation following which the element is heated or contacted with a solvent which removes the exposed areas but permits the unexposed areas to remain as a positive resist.

According to Barney U.S. Pat. No. 3,102,811, issued Sept. 3, 1963, it is known to employ the color forming property of a light-sensitive aromatic 1,2-dialdehyde in providing a copy process. The dialdehyde is exposed to a light source which destroys the aldehyde imagewise and the unexposed aldehyde is reacted with an ammonium salt to form a colored image. An exposure of up to 16 minutes might be required.

Poly(methyl methacrylate), (PMMA) has been used as a positive working resist material within the microelectronic industry. The PMMA is typically exposed to an electron beam with an exposure charge density in the region of $5 \times 10^{-5}$ to $5 \times 10^{-4}$ coulomb / cm$^2$ which causes random chain scission of the molecular chains. Development occurs by dissolving away molecules of low molecular weight but leaving unaffected those of high molecular weight. However, it has been desirable to have available a resist which is faster than PMMA.

The criteria on which a resist is evaluated for microelectronic device fabrication are:
1. Speed
2. Resolution
3. Chemical Resistance
4. Adhesion to substrate It has been found both theoretically and in practice that higher resolution is obtainable by electron beam exposure than by optical methods. Electron beam sensitivity is therefore a practical requirement of the resist where a very high resolution is required.

The speed of positive-working electron-beam resists is expressed in terms of the incident charge required per unit area to render the coating completely removable. With PMMA, the minimum necessary exposure is $5 \times 10^{-5}$ coulomb/cm$^2$. This is for a 0.4 to 0.8$\mu$m coating, developed by a standard procedure in 3/1 (by volume) isopropanol/methyl isobutyl ketone as described by R. A Harris, J. Electrochem. Soc., 120, 270(1973).

It is an object of this invention to provide a photodepolymerization process of greater speed than that described above and which uses stable polymers. Another major object of this invention is to provide a process which is negative-working, to complement the existing positive-working diazo process. Further objects are to provide elements which may be processed under dry conditions, and which will give neutral images of greater stability than diazo images. A further object of this invention is to provide a process that can produce visible or fluorescent images of sufficiently high resolving power for micrographic applications, and that may also yield relief images for resist and chemical milling applications.

SUMMARY OF THE INVENTION

A radiation-sensitive composition comprises a depolymerizable polymer, such as a polymer of an aromatic 1,2-dialdehyde, which composition may contain a sensitizer capable upon absorption of radiation of yielding products which will cause depolymerization of the polymer when it is subsequently heated to a temperature of up to about 150°C. The preferred depolymerizable polymer is a polymer of o-phthalaldehyde. The sensitizer may be, for example, a combination of carbon tetrabromide, diphenylamine and triphenylmethane which, upon exposure to radiation, yields hydrogen bromide. A radiation-sensitive element according to this invention comprises a support having thereon, for example, a polymer of o-phthalaldehyde and may also contain a radiation-sensitive substance or combination of substances, and may also contain a binder such as a soluble polyester resin, and a substance or combination of substances such as an ammonium salt, which is capable of forming a colored reaction product with the monomer, for example, o-phthalaldehyde, produced in the depolymerization reaction.

The negative-working process of this invention comprises imagewise exposure of an element to radiation following which the element is heated to a temperature of up to about 150°C to obtain a monomer, such as o-phthalaldehyde, in those regions of the element which had been exposed to radiation. Various methods may be utilized to render the image readable.

For instance, heat alone will yield a visible negative image due to the chemical reaction of released monomeric aldehyde, for example, o-phthalaldehyde, with a color former, such as ammonium thiocyanate. This color former may be contained in the original element, either in the same coating as the depolymerizable polymer or in a separate element which is heated in contact with the exposed element.

In still another embodiment, a visible image is developed by means of a heat treatment of the exposed element in an atmosphere containing a gaseous color-forming reagent, such as ammonia. In an alternative embodiment, the gaseous color-forming reagent, such as ammonia, can be provided by heating the exposed element in contact with a developer sheet containing a heat labile source of the reagent, for example, ammonium formate.

A positive-working radiation-sensitive process comprises exposing a radiation-sensitive element to radiation following which the element is heated or contacted with a solvent which removes the exposed areas but permits the unexposed areas to remain as a positive resist.

It is an advantage of this invention that the depolymerization of poly(phthalaldehyde), once it has been initiated, is irreversible above −43°C. Detailed Description The preferred polymer in the practice of this invention, poly(o-phthalaldehyde) (PPA), may be prepared using the methods disclosed by Aso and co-workers, J. Polym. Sci., Part A-1, 7, 497 (1969). The polymerization of o-phthalaldehyde, carried out at −78°C in dichloromethane, was found to be a rapid, homogeneous, cationic polymerization when initiated by diethyl ether-trifluoroborane, and the polymer could be isolated by precipitation in methanol. The molecular weight of poly(o-phthalaldehyde) may vary widely, but satisfactory results have been obtained using photothermographic compositions containing poly(o-phthalaldehyde) with molecular weights from about 10,000 to about 100,000, preferably about 15,000 to about 45,000.

The polymer chains are believed to comprise recurring units of the structure:

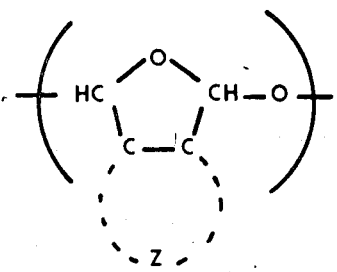

wherein Z represents the atoms necessary to complete an ortho aromatic group, preferably an ortho phenylene group. Examples of such aromatic groups are o-phenylene, 1,2-naphthylene, 2,3-naphthylene, 4-methyl-1,2-phenylene, 4-chloro-1,2-phenylene, 4,5-dimethyl-1,2-phenylene, and the like.

In another embodiment, the polymer chains are believed to comprise recurring units of the structure:

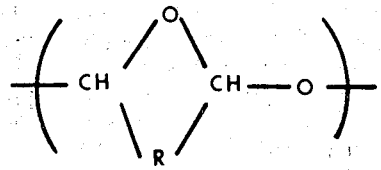

wherein R represents the atoms necessary to complete a 5- or 6-membered ring having an aromatic group fused thereto at its ortho- or peri-positions. peri-naphthylene represents the 6-membered ring structure.

It is believed that the end groups of the polymer molecules consist of a hydroxyl function which would be considered an uncapped end.

Ortho phthalaldehyde will copolymerize with styrene in such a way that poly(phthalaldehyde) molecules are essentially endcapped with polystyrene units. C. Aso, S. Tagami, and T. Kunitake, J. Polym. Sci., Part A-1, 8, 1323 (1970). Nonendcapped poly(phthalaldehyde) is stable for at least seven (7) months when stored in the dark under ambient conditions as indicated by inherent viscosity studies. Endcapping with styrene improves the stability of the polymer inasmuch as no change in inherent viscosity under similar storage conditions has been observed for one (1) year.

A radiation-sensitive substance or combination of substances, identified herein simply as a sensitizer, may be incorporated into the radiation-sensitive composition with the depolymerizable polymer. The sensitizer may produce a free radical upon radiation which induces depolymerization. Preferably, the sensitizer comprises a substance or combination of substances which will release or produce an acidic material upon exposure to radiation, such as ultraviolet radiation. Such materials are well known in the art and encompass a wide range of substances, including halogen compounds such as those disclosed in U.S. Pat. No. 3,042,515, U.S. Pat. No. 3,667,954, and U.S. Pat. No. 3,707,377. Specific examples of halogen-containing compounds which may function as sensitizers are: carbon tetrabromide; carbon tetraiodide; iodoform; hexachloroethane; pentabromoethane; 1,2,3,4-tetrabromobutane; hexabromocyclohexane; hexabromobenzene; α,α-dibromo-p-nitrotoluene; 2,2,4'-tribromoacetophenone; 2-(tribromomethylsulfonyl)benzothiazole; and 1-methyl-3,5-bis(tribromomethyl)triazine.

Other sensitizers include diazo compounds, such as certain diazonium salts and o-quinonediazides, and also certain o-nitrobenzaldehydes, which may or may not contain halogen atoms. Particularly useful are certain combinations of substances, such as carbon tetrabromide with diphenylamine and triphenylmethane, pentabromoethane with triphenylamine, α,α-dibromo-p-nitrotoluene with 4-quinolizone, and 2,2,4'-tribromoacetophenone with 2-benzoylmethylene-1-methyl-β-naphthothiazoline. Alternatively, the radiation-sensitive substance or moiety may be incorporated into a polymer chain, or appended to a polymer chain.

Radiations which may be used to depolymerize the depolymerizable polymers include electron beams such as those described by M. Hatzakis, J. Electrochem. Soc., 116, 1033–7 (1969).

Since the polymeric material has been found to be capable of depolymerizing in the presence of acidic species, that is, electron-poor species, it is advantageous to expose such a resist material with a beam of positive particles, such as protons or alpha particles. This might be accomplished, for example, by means of a device such as the scanning proton microscope reported on page 11 of the July 2, 1973, issue of Chemical and Engineering News. In general, high energy radiations can be used including alpha, beta and gamma radiations, x-rays, etc.

Many of the sensitizers useful in this invention exhibit their maximum sensitivity in the ultraviolet range so that a particularly useful radiation source furnishes an effective amount of ultraviolet radiation. Such sources include carbon arcs, mercury vapor lamps, fluorescent lamps with special ultraviolet light emitting phosphors, photographic flood lamps, and sunlamps. Of these, the mercury vapor lamps have been used most frequently, and are usually placed a distance of about 2–12 inches from the photothermographic element that is to receive the image.

Fluorescent pigments or phosphors which give off ultraviolet radiations when subjected to imagewise exposure to x-ray radiation can be dispersed in the light-sensitive polymer In the practice of this invention, the sensitized dried coating may range in thickness from 0.01 to about 1000 micrometers, preferably 0.1 to about 100 micrometers. The depolymerizable polymers useful in this invention may comprise from about 1 to about 100 percent by weight of the total composition, being near 100 percent for resist applications, but preferably 20 to 40 percent when used with a binder, such as a suitable polymer, in other imaging applications. The compositions of the invention may be used for various purposes in which a binder would be desirable such as, for example, micrographic applications. Any suitable binder may be used, for example the following: cellulose acetate, cellulose acetate butyrate, cellulose acetate propionate, ethyl cellulose, polyesters, polycarbonates, novolacs, vinyl polymers and copolymers, etc. In a preferred embodiment, poly[4,4'-isopropylidenebis(phenyleneoxyethylene)-co-ethylene terephthalate] 50/50 is used. This polymer is a random polyester prepared from terephthalic acid, 2,2-bis[4-(β-hydroxyethoxy)phenyl]propane and ethylene glycol in a mole ratio of approximately 2:1:1.

In other formulations, in order to form visible light absorbing images, numerous color-forming reactions of the monomer, for example, o-phthalaldehyde, may be used. Preferred color-forming reactants are gaseous ammonia and certain ammonium salts, such as ammonium formate and ammonium thiocyanate, which are thought to serve as sources of ammonia. Examples of other materials which react with aldehydes, and in particular with o-phthalaldehyde, to produce visible light absorbing or fluorescent products in many cases are: organic amines; hydroxylamine; hydrazine and its substituted derivatives; salts and esters of malonic acid; phenyl disulfide; p-phenylenediamine hydrochloride; histamine dihydrochloride; the combination of urea and citric acid; the combination of butylurea with acid; 4-amino-3-hydrazino-5-mercapto-1,2,4-triazole; and certain phthalocyanine dye precursors, such as DuPont Lusanne Brilliant Blue B and Farbenfabriken Bayer's Phthalogen Brilliant Blue IF3G.

The thermographic imaging process of this invention is principally negative-working, that is, the visible image is produced as a result of the absorption of radiation, followed by an appropriate development procedure. The process is quite versatile in that it can be formulated into several diverse embodiments which may differ widely in the method of image development. In particular, the thermographic process may consist, first, of imagewise exposing with radiation, a thermographic element comprising a support having thereon a thermographic composition comprising a depolymerizable polymer, such as a polymer of an aromatic 1,2-dialdehyde, e.g., o-phthalaldehyde, and a sensitive substance or combination of substances, and which thermographic composition may also contain a binder, such as a soluble polyester resin. Following exposure, the thermographic element may be heated to a temperature of up to about 150°C in order to accelerate the depolymerization reaction which was initiated by the exposure. The visible image may be obtained by simultaneously or subsequently heating to a temperature of up to about 150°C in the presence of a gaseous color-forming reagent, such as ammonia, which forms a visible colored material with the monomer, for example, o-phthalaldehyde, produced by the depolymerization reaction.

In an alternative embodiment of this thermographic process the image may be obtained by heating the exposed element in contact with a developer sheet, containing a heat labile source of a gaseous color-forming reagent, for example ammonium formate, ammonium acetate, or ammonium carbonate, as a heat labile source of ammonia. Development of an image by means of heat alone may be accomplished by incorporating into the thermographic composition, or in a distinct stratum in the thermographic element, a substance or combination of substances, such as those listed above, which on heating will form a visible reaction product with a monomer, such as o-phthalaldehyde, produced in radiation-exposed regions of the element. In still other embodiments, the substance or combination of substances which on heating is capable of reacting with the monomeric 1,2-dialdehyde, may be carried on a separate support from the thermographic element itself. For example, the color-forming substance or combination of substances may be coated on, or imbibed in, a paper support or may be coated on a film support. In these embodiments, heating of the exposed thermographic element in contact with the separate element containing the color former may cause a visible or fluorescent image to appear in the separate element, or in both elements, by virtue of the volatility of the monomer. More than one transferred image may be produced in receiver elements from a single exposed photothermographic element.

The thermographic elements of this invention may be formulated and used in such a way as to obtain relief images. This process is principally positive-working, that is, the material which is exposed to radiation is followed by an appropriate development procedure which removes the exposed areas. The process is quite versatile in that it can be formulated into several diverse embodiments which may differ widely in the method of image development. In particular, the thermographic process may be comprised, first, of imagewise exposing with radiation, a thermographic element comprising a support having thereon a thermographic composition comprising a depolymerizable polymer, such as a polymer of an aromatic 1,2-dialdehyde, e.g., o-phthalaldehyde, which may contain a sensitive substance or combination of substances and may also contain a dye or pigment to render the resist visible. Following exposure, the thermographic element may be heated to a temperature of up to about 150° C in order to accelerate the depolymerization reaction which was initiated by the exposure and drive off the released monomer. A visible image may be obtained simultaneously or subsequently by heating to a temperature of up to about 150°C and washing the surface with a solvent for the monomer or by washing with the solvent for the monomer without heating.

Solvents for the monomer which are not solvents for the polymer include nitromethane, acetonitrile, toluene, acetone, 2-butanone, 4-methyl-2-pentanone, methyl acetate, ethyl acetate, 2-methoxyethanol, carbon tetrachloride, cyclohexane, methanol, ethanol, iso-propanol, n-butanol, etc.

The following examples are included for a further understanding of the invention:

EXAMPLE 1

A solution was prepared from
75.0 mg poly(phthalaldehyde),
150.0 mg *polyester
20.0 mg tetrabromomethane,
20.0 mg triphenylmethane,
20.0 mg diphenylamine,
1.6 ml dichloromethane, and
0.6 ml chlorobenzene
* Poly[4,4'-isopropylidene(bisphenyleneoxyethylene)-co-ethylene terephthalate] 50/50

A random polyester of terephthalic acid, 2,2-bis-4-(β-hydroxyethoxy) phenyl propane, and ethylene glycol having a mole composition of approximately 2:1:1 contains the following repeat units:

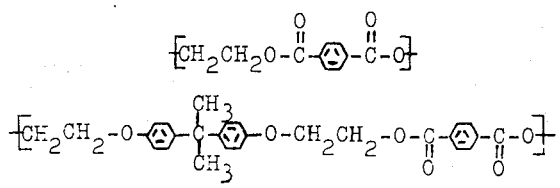

and was coated on polyester film support with a doctor blade set at 5 mils and dried in air at 43°C; the resultant coating was then cured at 95°C for 3 minutes.

A sample of this coating was exposed to UV light for 10 seconds in a 3M Filmsort "Uniprinter 086" Copier through a step wedge test object. Following exposure, the sample was heated at about 90°C for 5 seconds and then was placed for 30 seconds in a chamber containing ammonia vapor at about 125°C. The resulting near-neutral negative image had a maximum visible density of 2.00, a minimum visible density of 0.06, and an average contrast of 1.41.

EXAMPLE 2

A solution similar to that of Example 1 but containing α,α-dibromo-p-nitrotoluene in place of the combination of tetrabromomethane, triphenylmethane, and diphenylamine was coated on a support as in Example 1. A sample of this coating was exposed for 10 seconds in a copier through a negative-appearing microphotograph. The sample was developed by heating at about 90°C for 5 seconds, followed by 30 seconds of treatment with ammonia vapor at about 125°C. There resulted in the sample a sharp, grainless, positive-appearing copy of the original microphotograph, with minute details faithfully reproduced.

EXAMPLE 3

A variety of radiation-sensitive substances can be employed. Coated film elements were prepared as in Example 2 using one of the following materials in place of the α,α-dibromo-p-nitrotoluene; 1,2-dibromo-1-phenyl-2-(p-nitrophenyl)ethane; ethyl 2,3-dibromo-3-(p-nitrophenyl)-propionate; 4-trichloroacetylimino-4H-flavene; 1,2-dibromoethylbenzene; 2,2,4'-tribromoacetophenone; α,α,α',α'-tetrabromo-o-xylene; o-nitrobenzaldehyde; 2,4-dinitrobenzaldehyde; 2,6-dinitrobenzaldehyde; 2,4,6-trinitrobenzaldehyde; 2-tribromomethylquinoline; pentabromoethane; iodoform; or a diazonium tetrafluoroborate. In each case, a positive appearing image was obtained in the film element after exposure and development as in Example 2.

EXAMPLE 4

Ten milliliters of water was mixed with 20 ml of a 28.5 percent (by weight) hydrosol of a terpolymer of vinylidene chloride, acrylonitrile, and acrylic acid. The pH of this mixture was adjusted to approximately 5.5 with concentrated aqueous ammonia, and then 2.0 g of ammonium thiocyanate was added and dissolved. The final mixture was coated on subbed polyester film support with a doctor blade set at 1 mil and dried in air at 43°C; the resultant coating was cured at 95°C for 3 minutes.

A solution prepared from
750.0 mg poly(phthalaldehyde),
1.5 g *polyester (as in Example 1)
250.0 mg pentabromoethane,
50.0 mg triphenylamine,
15.0 ml dichloromethane, and
7.0 ml chlorobenzene
was then coated over the above coating with a doctor blade set at 5 mils and allowed to dry in air at 35°C; the assembled film element was cured at 95°C for 3 minutes.

A sample of this assembly was exposed for 15 seconds in a copier through a negative-appearing micro photographic film bearing reduced half-tone images. On subsequent heating of the sample at about 115°C for 5 seconds, there was obtained in the element a near-neutral, positive-appearing and faithfully detailed reproduction of the test object.

the first coating can alternatively be prepared using a water-soluble polymer, in which case the first solution can be acidic, neutral, or alkaline.

EXAMPLE 5

To illustrate that the ammonium thiocyanate-containing coating may alternatively be placed over the poly(phthalaldehyde) coating, a solution prepared from 75.0 mg poly(phthalaldehyde),
150.0 mg *polyester (as in Example 1)
25.0 mg pentabromoethane,
5.0 mg triphenylamine,
1.5 ml dichloromethane, and
0.7 ml chlorobenzene was coated on polyester film support with a doctor blade set at 5 mils and dried in air at 35°C; this coating was then cured at 95°C for 3 minutes.

Over the above there was coated, by means of a whirler device operating at 500 rpm, a thin layer of the solution prepared from 2.0 g a copolymer of ethyl acrylate and acrylic acid,
1.0 g ammonium thiocyanate, and
25.0 ml methanol.

Then, the assembled film element was cured at 100°C for 3 minutes.

A sample of this assembly was exposed for 15 seconds in the Filmsort Copier through a step wedge test object. Subsequently, when the sample was pressed for 15 seconds to a metal plate at about 85°C (film support to plate), there was developed a black negative image of the test object in the sample.

Another sample of the assembled film element was similarly exposed for 30 seconds. In this case, a clear negative image was printed out during the exposure; the image density was increased on heating the sample as above.

EXAMPLE 6

A solution like that of Example 4 was coated on a polyester film support with a doctor blade set at 5 mils and dried in air at 35°C; this coating was then cured at 95°C for 3 minutes.

A developer sheet was prepared by dipping a piece of filter paper into a solution composed of 10 g of ammonium formate plus 5 ml of water plus 20 ml of methanol, followed by drying of the impregnated paper in air for one hour.

A sample of the coated film element was exposed for 5 seconds through a positive-appearing microphotographic film bearing reduced half-tone images. On subsequent heating of this sample at about 115°C for 5 seconds in contact with the developer sheet, there was obtained in the film element a black, negative-appearing and faithfully detailed reproduction of the test object.

EXAMPLE 7

A coated film element similiar to that of Example 2 was exposed for 30 seconds through a step wedge test object. The film element was then heated at about 115°C for 5 seconds in contact with a developer sheet like that of Example 6, whereupon there were obtained sharp, black negative images of the test object in both the film element and the developer sheet.

EXAMPLE 8

A developer solution was prepared from 10 g of imidazole plus 10 g of ammonium chloride plus 100 ml of water. A coated film element similar to that of Example 2 was exposed for 30 seconds in the Filmsort Copier through a step wedge test object. On immersing the exposed element for 5 seconds in the developer solution at about 70°C, there appeared in the film element a sharp, negative image of the test object. Other aqueous solutions can be used successfully as developing agents in place of the imidazole-ammonium chloride solution, for example: 5 percent histamine dihydrochloride; or 10 percent ammonium formate; or 10 percent malonic acid, adjusted to pH 5.0 with concentrated aqueous ammonia.

EXAMPLE 9

By means of a whirler device operating at 500 rpm, a film element similar to that of Example 2 was coated with a thin layer of the following mixture: 20 ml of the polymer hydrosol described in Example 4, ten milliliters of water, 5 drops of concentrated aqueous ammonia, and 1.0 g of ammonium bromide. After drying in air at room temperature, this assembled film element was dried at 100°C for 2 minutes.

A sample of the assembly was exposed for 30 seconds through a negative-appearing microphotograph. The sample was developed by heating at about 90°C for 5 seconds, followed by 5 seconds of immersion in a 10 percent aqueous imidazole solution at 80°C. There resulted in the film element a high-contrast, positive-appearing reproduction of the test object.

EXAMPLE 10

To demonstrate that the ammonia development process of Examples 1 through 3 will operate when an absorbent paper support is used instead of a nonabsorbent film support, the solution prepared from 50.0 mg poly(phthalaldehyde),
50.0 mg copolymer of vinyl and vinylidene chlorides,
1.2 mg 2,2,4'-tribromoacetophenone, and
1.5 ml dichloromethane was coated onto an ordinary 3 × 5 card and dried in air at room temperature. A sample of this element was imagewise exposed for 1 minute using a 140-watt Hanovia Utility Model Quartz Lamp, without filter, at a distance of approximately 10 cm. Upon subsequent treatment for 1 minute with moist ammonia vapor at about 110°C, there appeared in the paper element a black, negative reproduction of the image.

EXAMPLE 11

To demonstrate that monomeric phthalaldehyde can be caused to form an image external to a poly(phthalaldehyde) film element, image receptor sheets were prepared and used as follows: Paper samples having thereon a gelatin-baryta layer were immersed for 5 or 6 minutes (with agitation) in a solution comprising either 50g of ammonium formate or 50g of ammonium thiocyanate in 150 ml of water. Following this, the coated sides of the papers were rinsed quickly with water and blotted, after which the papers were thoroughly dried in air at room temperature.

A coated film element similar to that of Example 2 was exposed for 45 seconds through a continuous-tone photographic negative. The sample was then heated at about 130°C for 5 seconds in contact withg the ammonium formate-containing paper receptor sheet which had been stored in ambient air for 6 days. A sharp, neutral, positive image was thereby developed in both the film element and the paper receptor sheet.

Another sample of the same coated film element was exposed for 75 seconds through a continuous-tone photographic negative, this time using unfiltered radiation from an ultraviolet lamp at a distance of about 20 cm. This sample was then heated at about 130°C for 5 seconds in contact with the ammonium thiocyanate-containing paper receptor sheet. A sharp, neutral, positive print of the image was thereby developed in the paper receptor sheet. In this case, there was practically no optical density developed in the film element because of the significantly lower volatility of ammonium thiocyanate (as compared with that of ammonium formate).

EXAMPLE 12.

A solution prepared from
200.0 mg poly(phthalaldehyde),
10.0 mg tetrabromomethane,
10.0 mg triphenylmethane,
10.0 mg diphenylamine, and
1.5 ml dichloromethane was coated on polyester film support with a doctor blade set at 6 mils and dried in air at room temperature.

A sample of this coating was partially covered with black paper and partially covered with a piece of fine-mesh wire screen, leaving part uncovered. The sample was then exposed for 1 minute at a distance of about 20 cm. Following exposure, the sample was heated at about 100°C for 5 minutes and then was placed for 30 minutes in an atmosphere of moist ammonia vapor at room temperature. There resulted in the film element a positive image of the black paper and the screen, with a visible density of 0.18 in exposed areas and of 1.05 in unexposed areas.

EXAMPLE 13

A coated film element was prepared as in Example 12. Sections of the resulting element were exposed as in Example 12 for 0, ¼, ½, 1, 2, and 4 minutes with no noticeable effect. The sample was then heated at about 95°C for 3 minutes, following which xerographic toner adhered to all exposed areas but not to the unexposed portion.

EXAMPLE 14

A solution prepared from
99.0 mg poly(phthalaldehyde),
1.0 mg 2,2,4'-tribromoacetophenone, and
1.5 ml dichloromethane was coated on a support as in Example 12. A sample of this coating was exposed—in sections—for 0, 2, and 5 seconds to unfiltered radiation from an ultraviolet lamp at a distance of about 10 cm. As a result (that is, even without heating), the section receiving 5 seconds of exposure becomes tacky.

EXAMPLE 15

A solution prepared from
50.0 mg poly(phthalaldehyde),
100.0 mg *polyester (as in Example 1)
10.0 mg tetrabromomethane,
10.0 mg triphenylmethane,
10.0 mg diphenylamine,
1.2 ml dichloromethane, and
0.3 ml chlorobenzene was coated on polyester film support with a doctor blade set at 5 mils and dried in air at room temperature. A sample of this coating was exposed for 30 seconds through a test object bearing positive-appearing letter text, using radiation from an ultraviolet lamp at a distance of about 10 cm. When the coating was then placed for 30 seconds between metal plates at about 90°C, imagewise (negative-appearing) transfer of coated materials took place from exposed areas to the metal plate which contacted the coating.

EXAMPLE 16

A solution prepared from
105.0 mg poly(phthalaldehyde),
10.0 mg 1,2-dibromoethylbenzene, and
1.5 ml dichloromethane was coated on polyester film support with a doctor blade set at 6 mils and dried in air at room temperature.

A sample of the resultant coating was partially covered with black paper, and the remainder was exposed for 1 second to unfiltered radiation from an ultraviolet lamp at a distance of about 10 cm. Following exposure, the sample was heated at about 110°C for 1 minute, resulting in essentially complete depolymerization of the coated poly(phthalaldehyde) in the exposed area but with no effect on the coating in the unexposed area.

Another solution, like the above but containing no 1,2-dibromoethylbenzene, was coated on a support in identical fashion. In this case, no effect was observed on 4-minute exposure followed by 2 minutes of heating at about 110°C, and only slight depolymerization was observed on 8-minute exposure followed by 2 minutes of heating.

EXAMPLE 17

A solution prepared from
300.0 mg poly(phthalaldehyde),
10.0 mg tetrabromomethane,
10.0 mg triphenylmethane,
10.0 mg diphenylamine, and
2.5 ml dichloromethane was coated on polyester film support with a doctor blade set at 5 mils and dried in air at room temperature.

A sample of the resulting coated film element was partially covered with black paper, and the remainder was exposed for 2 minutes to radiation from an ultraviolet lamp at a distance of approximately 20 cm.

Following exposure, the sample was heated at about 100°C for 10 minutes. As a result, a sharp boundary was apparent between exposed and unexposed areas; the film support appeared completely free of coated materials in exposed areas, while the coating remained intact in unexposed areas.

EXAMPLE 18

A solution of 5 g of poly(o-phthalaldehyde), in 100 ml of 7/3 (by volume) dichloromethane/chlorobenzene was coated on a glass microscope slide by spinning the slide at 500 rpm. After the coating had been air-dried for several minutes, it was heated in an air oven at 100°C for 3 minutes (without visible effect). The coating was exposed for varying times at below $10^{-5}$ torr over circular areas of ¼-inch diameter (0.32 cm$^2$) with an electron beam operated at 15 kV and $1 \times 10^{-7}$ amp. All exposed circles were visible, down to an exposure time of 30 seconds, though no exposed area was completely removed by exposure alone. The exposed coating was heated at 100°C for 5 minutes, without further visible effect. On spraying methanol over the coating for 5–10 seconds, followed by gentle rubbing of the coated slide with a methanol-moistened tissue, areas of the coating which had been exposed for one minute or more were completely removed from the glass substrate, while all other areas remained intact. This result means that the PPA coating required an exposure no greater than $1.9 \times 10^{-5}$ coulomb/cm$^2$ and hence was approximately 2½ times as fast as poly(methyl methacrylate) (PMMA).

EXAMPLE 19

A coating solution similar to that of Example 18, but containing α,α-dibromo-p-nitrotolueme, (DBNT) (30% of the poly(phthalaldehyde) weight), was coated on unsubbed polyester film support with a doctor blade set at 1 mil and dried in air at about 100°F. The resultant coating was heated in an air oven at 95°C for 3 minutes, without visible effect. The coating was then exposed in a fashion similar to that of Example 18 except that the electron beam was operated at 10 kV and $1 \times 10^{-8}$ amp. Development of coated areas exposed for 15 seconds or more was achieved either by heating at 100°C for 3 minutes or by treatment with liquid methanol. This result means that the coating was rendered developable by an exposure no greater than $4.7 \times 10^{-7}$ coulomb/cm$^2$ and hence was more that 100 times faster than PMMA.

It was found that the presence of 30% DBNT in PMMA caused about a five-fold reduction in speed. Thus, the marked speed enhancement caused by DBNT with poly (phthalaldehyde) cannot be predicted from experience with PMMA, and indicates that poly(phthalaldehyde) operates as an electron-beam resist material by a mechanism different from that of PMMA.

EXAMPLE 20

A coating similar to that of Example 19, but containing 3 instead of 30% of DBNT, was prepared and exposed with an electron-beam as in Example 2. Coated areas exposed for 30 seconds or more were developable as in Example 19, which means that this coating was more than 50 times faster than PMMA.

Poly(phthalaldehyde) offers the distinct advantage in resist applications of being highly resistant to alkalis, even hot concentrated sodium hydroxide solution.

The invention has been described with particular reference to preferred embodiments thereof but it will be understood that variations and modifications can be effected within the spirit and scope of the invention.

I claim:

1. A radiation-sensitive element comprising a thin film of a depolymerizable polymer of an aromatic 1,2-dialdehyde, said polymer having hydroxyl or polystyrene endcaps and a sensitizer capable, upon absorption of radiation, of producing products capable of initiating the depolymerization of said polymer.

2. An element of claim 1 in which said film has a thickness of about 0.01 to about 1000 micrometers.

3. An element of claim 1 in which said polymer is a polyphthalaldehyde.

4. An element of claim 1 in which said polymer is a polynaphthalenedicarboxaldehyde.

5. An element of claim 1 in which said sensitizer liberates an acid upon exposure to radiation.

6. An element of claim 1 in which said sensitizer is a halogenated compound which liberates an acid upon exposure to radiation.

7. An element of claim 1 in which said sensitizer is sensitive to ultra violet radiation.

8. An element of claim 1 in which said sensitizer is sensitive to electron beam radiation.

9. An element of claim 1 in which said sensitizer is selected from the class consisting of tetrabromoethane, carbon tetrabromide, pentabromoethane, tribromoacetophenone dibromoethylbenzene and p-nitrobenzal bromide.

10. An element of claim 1 in which said sensitizer is α,α-dibromo-p-nitrotoluene.

11. An element of claim 1 in which said sensitizer is a mixture of tetrabromoethane, triphenylmethane and diphenylamine.

12. An element of claim 1 which also contains a binder.

13. An element of claim 12 in which said binder is a polyester resin.

14. A photographic element of claim 1 in which said support is a flexible support.

15. An element of claim 1 in which said support is a polyester.

16. A process of producing an image by imagewise depolymerization comprising imagewise exposing to radiation a coating comprising a polymer of an aromatic 1,2-dialdehyde, said polymer having hydroxyl or polystyrene endcaps.

17. A process of claim 16 in which said polymer is exposed to an electron beam.

18. A process of claim 16 in which said polymer is a polyphthalaldehyde.

19. A process of claim 16 in which said polymer is a polynaphthalenedicarboxaldehyde.

20. A process of claim 16 in which an amine or ammonia is contacted with the exposed coating at a temperature of about 90 to about 150°C.

21. A process of producing an image by imagewise depolymerization comprising imagewise exposing a coating comprising a polymer of an aromatic 1,2-dialdehyde, said polymer having hydroxyl or polystyrene endcaps and a sensitizer capable, upon absorption of radiation, of yielding an acidic product, and heating said composition to about 90° C to about 150° C.

22. A process of claim 21 comprising contacting the heated coating with ammonia or an amine.

23. A process of claim 21 comprising contacting the heated coating with a solvent for the exposed coating.

24. A process of claim 21 in which said sensitizer upon irradiation, yields HBr.

25. A process of obtaining an image by depolymerization comprising exposing to electromagnetic radiation a photographic element comprising a polymer of an aromatic 1,2-dialdehyde, said polymer having hydroxyl or polystyrene endcaps and a sensitizer which, upon exposure, gives acidic products, contacting said element with a developer sheet comprising a support and a heat labile ammonia or amine-releasing compound and heating to a temperature of about 90° to about 150° C.

26. A process of claim 25 in which said ammonia-releasing compound is ammonium formate.

27. A process of claim 25 in which said ammonia-releasing compound is ammonium thiocyanate.

* * * * *